United States Patent
Kaji et al.

(10) Patent No.: US 10,361,273 B2
(45) Date of Patent: Jul. 23, 2019

(54) SILICON CARBIDE SUBSTRATE

(71) Applicant: SUMITOMO ELECTRIC INDUSTRIES, LTD., Osaka (JP)

(72) Inventors: Naoki Kaji, Hyogo (JP); Shunsaku Ueta, Hyogo (JP); Tsutomu Hori, Hyogo (JP); Shin Harada, Hyogo (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/758,113

(22) PCT Filed: Oct. 12, 2016

(86) PCT No.: PCT/JP2016/080277
§ 371 (c)(1),
(2) Date: Mar. 7, 2018

(87) PCT Pub. No.: WO2017/073333
PCT Pub. Date: May 4, 2017

(65) Prior Publication Data
US 2018/0254324 A1 Sep. 6, 2018

(30) Foreign Application Priority Data
Oct. 27, 2015 (JP) .................. 2015-210672

(51) Int. Cl.
H01L 29/16 (2006.01)
H01L 29/66 (2006.01)
H01L 21/02 (2006.01)
C30B 29/36 (2006.01)
C30B 23/00 (2006.01)

(52) U.S. Cl.
CPC .......... *H01L 29/1608* (2013.01); *C30B 23/00* (2013.01); *C30B 29/36* (2013.01); *H01L 21/02378* (2013.01); *H01L 29/66068* (2013.01)

(58) Field of Classification Search
None
See application file for complete search history.

(56) References Cited

U.S. PATENT DOCUMENTS

| 7,427,326 B2 * | 9/2008 | Sumakeris | C30B 19/00 117/105 |
| 2009/0057685 A1 * | 3/2009 | Mochizuki | H01L 29/0804 257/77 |
| 2012/0285370 A1 * | 11/2012 | Gupta | C30B 23/005 117/84 |
| 2016/0032486 A1 * | 2/2016 | Hansen | C30B 23/025 117/106 |

FOREIGN PATENT DOCUMENTS

JP 2009-256159 11/2009

\* cited by examiner

*Primary Examiner* — Zandra V Smith
*Assistant Examiner* — Lawrence C Tynes, Jr.
(74) *Attorney, Agent, or Firm* — IPUSA, PLLC

(57) ABSTRACT

A silicon carbide substrate whose majority carrier density is $1 \times 10^{17}$ cm$^{-3}$ or greater is such that a standard deviation of minority carrier lifetime as obtained by µ-PCD analysis is 0.7 ns or less in an area other than an area within a distance of 5 mm from an outer perimeter of a main surface.

13 Claims, 4 Drawing Sheets

SILICON CARBIDE SUBSTRATE

TECHNICAL FIELD

The present invention relates to a silicon carbide substrate.

The present application claims priority based on Japanese application No. 2015-210672 filed on Oct. 27, 2015, the entire contents of which are hereby incorporated by reference.

BACKGROUND ART

Technology has been developed that performs hot isostatic pressing to reduce defects and distortion in the manufacturing of silicon carbide substrates (see Patent Document 1, for example). Successfully reducing defects and distortion in a silicon carbide substrate is considered to result in yield being improved in the manufacturing of semiconductor devices. Patent Document 1 also discloses that a decreased difference in carrier lifetime in the radial direction measured by μ-PCD (microwave photo conductivity decay) is able to indicate improvement in the distortion of a silicon carbide substrate.

RELATED-ART DOCUMENTS

Patent Document

[Patent Document 1] Japanese Patent Application Publication No. 2009-256159

SUMMARY OF THE INVENTION

A silicon carbide substrate according to an embodiment disclosed herein is a silicon carbide substrate whose majority carrier density is $1\times10^{17}$ cm$^{-3}$ or greater. The standard deviation of minority carrier lifetime as obtained by μ-PCD analysis is 0.7 ns or less in the area other than the area within a distance of 5 mm from the outer perimeter of a main surface.

MODE FOR CARRYING OUT THE INVENTION

Figure 1:
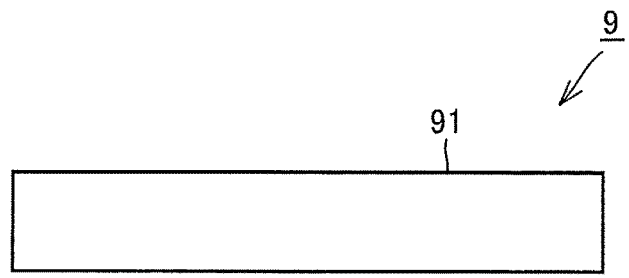
FIG. 1 is a schematic cross-sectional view illustrating the structure of a substrate.

Yield improvement is vital in the manufacturing of semiconductor devices utilizing silicon carbide substrates which are more expensive than silicon substrates. Accordingly, one of the objects of the present disclosures is to provide a silicon carbide substrate capable of improving yield in the manufacturing of semiconductor devices.

Description of Embodiments

Embodiments of the technologies disclosed in this application will be listed and described first. A silicon carbide substrate of the present application is a silicon carbide substrate whose majority carrier density is $1\times10^{17}$ cm$^{-3}$ or greater. In this silicon carbide substrate, the standard deviation of minority carrier lifetime as obtained by μ-PCD analysis is 0.7 ns or less in the area other than the area within a distance of 5 mm from the outer perimeter of the main surface.

The present inventors have studied measures to improve yield in the manufacturing of semiconductor devices utilizing silicon carbide substrates whose majority carrier density is $1\times10^{17}$ cm$^{-3}$ or greater, which is usable in the manufacturing of semiconductor devices such as SBDs (Schottky barrier diodes) and MOSFETs (metal oxide semiconductor field effect transistors). It was consequently found that reducing the standard deviation of minority carrier lifetime in the main surface of a substrate as obtained by μ-PCD analysis enables the reduction of on-resistance variation in the semiconductor device. To be more specific, maintaining the standard deviation of minority carrier lifetime at 0.7 ns or less in the area other than the area within a distance of 5 mm from the outer perimeter of the main surface effectively serves to reduce on-resistance variation in the semiconductor device.

In the silicon carbide substrate of the present application, the standard deviation of minority carrier lifetime as obtained by μ-PCD analysis is 0.7 ns or less in the area other than the area within a distance of 5 mm from the outer perimeter of the main surface. This arrangement effectively enables the reduction of on-resistance variation in a semiconductor device made by using the silicon carbide substrate. As a result, the silicon carbide substrate of the present application can improve yield in the manufacturing of semiconductor devices.

In the silicon carbide substrate noted above, the standard deviation may be 0.4 ns or less. This arrangement may further improve yield in the manufacturing of semiconductor devices.

The diameter of the silicon carbide substrate noted above may be 100 mm or greater. An increase in the diameter of the substrate serves to improve efficiency in the manufacturing of semiconductor devices.

The diameter of the silicon carbide substrate noted above may be 150 mm or greater. An increase in the diameter of the substrate serves to improve efficiency in the manufacturing of semiconductor devices.

In the silicon carbide substrate noted above, the average minority carrier lifetime may be 1 μs or less. Reducing the average minority carrier lifetime can reduce the forward degradation of a body diode (which is an embedded diode between the source and the drain and also referred to as a parasitic diode) formed in the semiconductor device.

In the silicon carbide substrate noted above, the average minority carrier lifetime may be 100 ns or less. Reducing the average minority carrier lifetime can reduce the forward degradation of a body diode formed in the semiconductor device.

In the silicon carbide substrate noted above, the average minority carrier lifetime may be 50 ns or less. Reducing the average minority carrier lifetime can reduce the forward degradation of a body diode formed in the semiconductor device.

The silicon carbide substrate noted above may be a silicon carbide substrate containing no carbon inclusion. The quality of the crystal can be improved by avoiding carbon inclusion, which is a chunk of carbon on the order of micrometers mixed in single crystals.

Details of Embodiments

In the following, an example of an embodiment of a silicon carbide substrate according to the technology disclosed in the present application will be described by referring to the drawings. In the following drawings, the same or corresponding elements are referred to by the same numerals, and a duplicate description thereof will be omitted.

By referring to FIG. 1, a silicon carbide substrate 9 of the present embodiment includes a main surface 91. The silicon carbide substrate 9 is comprised of single crystal silicon carbide having the 4H crystal structure, for example. The off-angle of the main surface 91 from the {0001} plane of silicon carbide constituting the silicon carbide substrate 9 is 4 degrees or less, for example. Namely, the angle between the main surface 91 and the {0001} plane is 4 degrees or less.

Figure 2:
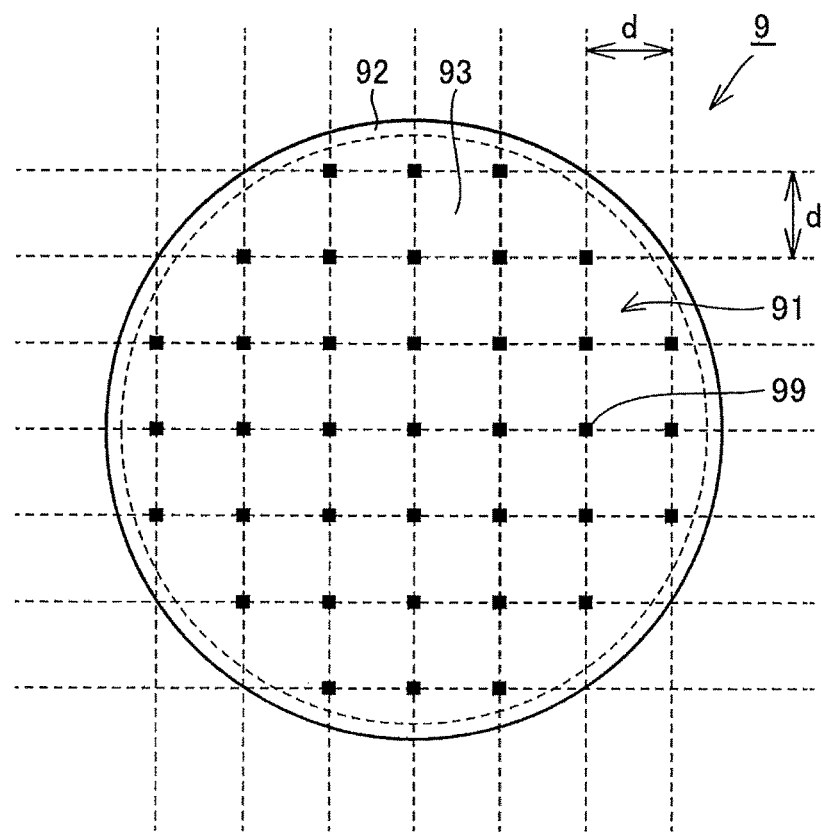
FIG. 2 is a schematic plan view for explaining the method of analysis by μ-PCD.

The silicon carbide substrate 9 has a disc shape by referring to FIG. 1 and FIG. 2. The diameter of the silicon carbide substrate 9 is 100 mm or greater, for example, and may preferably be 150 mm or greater. The silicon carbide substrate 9 having a larger diameter allows semiconductor devices (SBD, MOSFET, etc.) utilizing the silicon carbide substrate 9 to be efficiently manufactured. The thickness of the silicon carbide substrate 9 may be 300 µm or greater. The thickness of the silicon carbide substrate 9 may be 600 µm or less.

The silicon carbide substrate 9 contains N (nitrogen) as an n-type impurity for creating n-type carriers (electrons), which are majority carriers. Due to the fact that N serving as an n-type impurity is present, the majority carrier density of the silicon carbide substrate 9 becomes $1 \times 10^{17}$ cm$^{-3}$ or greater. A majority carrier density of $1 \times 10^{17}$ cm$^{-3}$ or greater ensures that the silicon carbide substrate 9 is suitable for the manufacturing of SBD, MOSFET, or the like.

By referring to FIG. 2, the standard deviation of minority carrier lifetime as obtained by µ-PCD analysis is 0.7 ns or less in the area (i.e., a center area 93 including the center point) other than an outer perimeter area 92 that is within a distance of 5 mm from the outer perimeter of the main surface 91. The µ-PCD analysis may be performed as follows.

By referring to FIG. 2, minority carrier lifetime is measured at measurement points 99 which are arranged at constant intervals d within the center area 93. The interval d may be 2 mm, for example. The diameter of a laser spot focused on the silicon carbide substrate 9 at the positions of the measurement points 99 may be 2 mm, for example. The wavelength of laser may approximately be 349 nm, for example. Minority carrier lifetime is equal to the length of time it takes for the intensity of a signal regarding minority carriers exited and created by illuminating the silicon carbide substrate 9 with laser to drop to 1/e of the peak value thereof. Here, e is Napier's constant. Minority carrier lifetimes measured at the measurement points 99 are statistically processed to calculate the standard deviation. The standard deviation of minority carrier lifetime as calculated in this manner is 0.7 ns or less in the case of the silicon carbide substrate 9 of the present embodiment. Further, the average minority carrier lifetime as calculated in this manner is 1 µs or less in the case of the silicon carbide substrate 9 of the present embodiment.

The average minority carrier lifetime may preferably be 100 ns or less, and may more preferably be 50 ns or less. A decrease in the average minority carrier lifetime reduces the forward degradation of a body diode formed in the semiconductor device.

In the case of the silicon carbide substrate 9, the standard deviation of minority carrier lifetime in the center area 93 as obtained by µ-PCD analysis is 0.7 ns or less. This arrangement effectively enables the reduction of on-resistance variation in the semiconductor device made by using the silicon carbide substrate 9. Consequently, the silicon carbide substrate 9 serves to improve yield in the manufacturing of semiconductor devices.

The standard deviation is preferably 0.4 ns or less in the silicon carbide substrate 9. This arrangement may further improve yield in the manufacturing of semiconductor devices.

Figure 3:
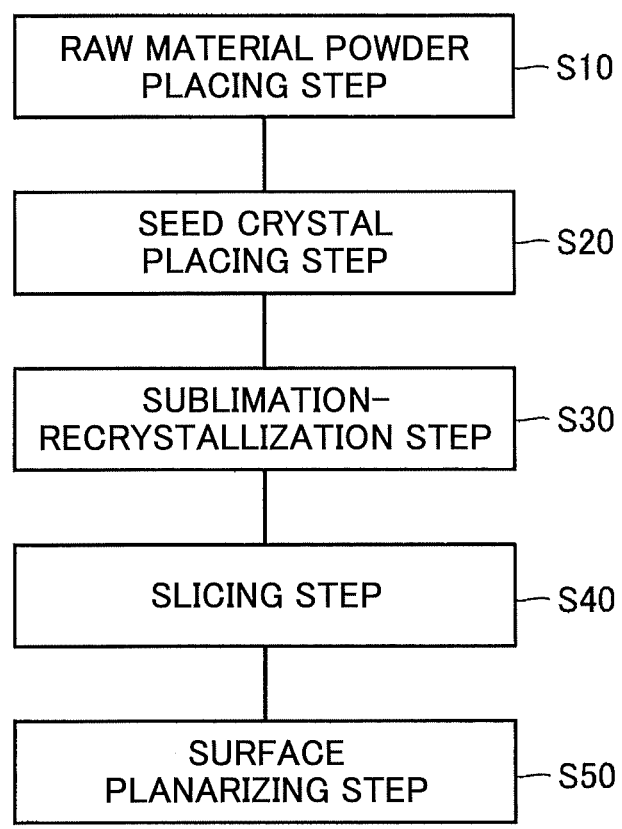
FIG. 3 is a flowchart illustrating a schematic method of making a silicon carbide substrate.
Figure 4:
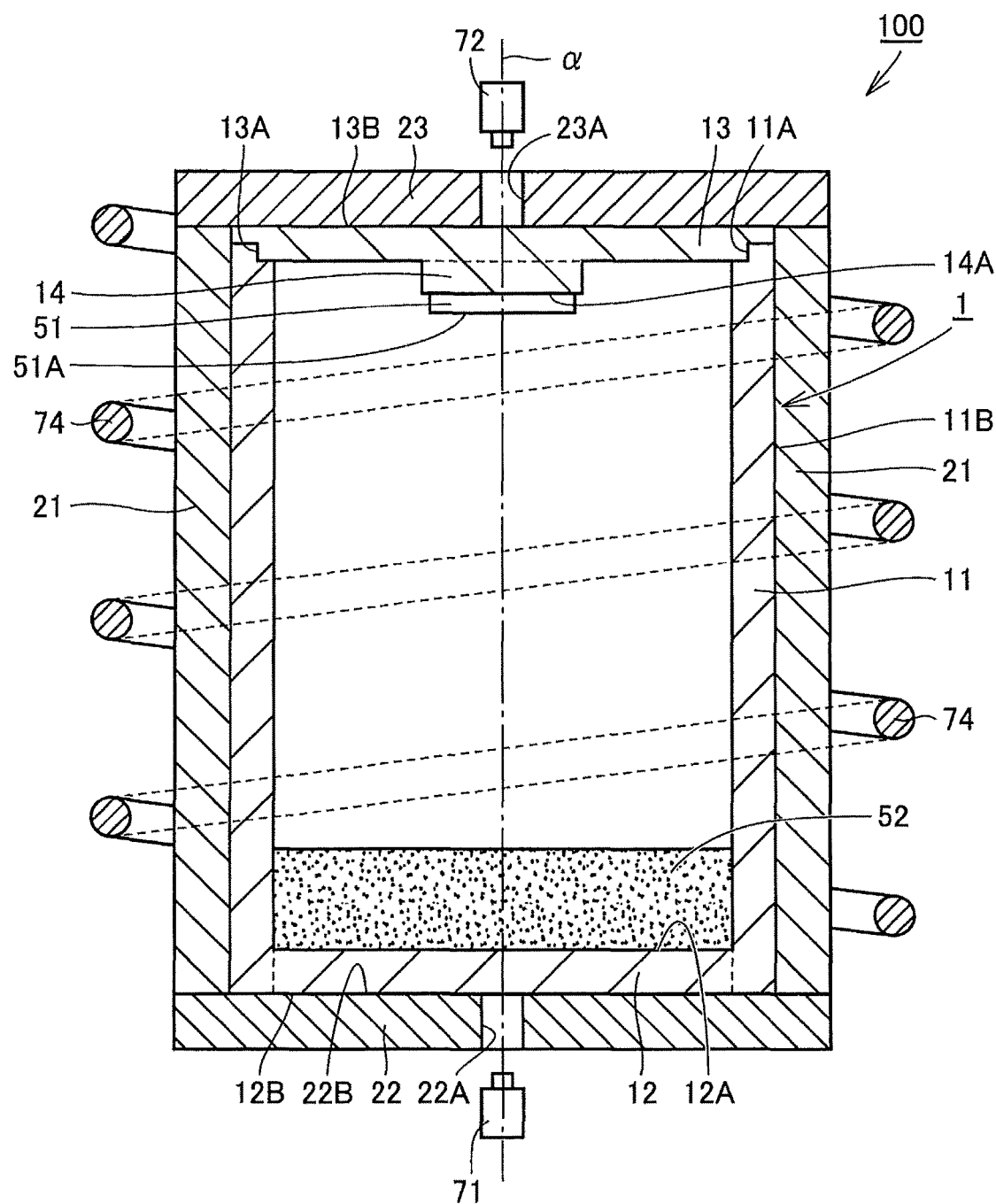
FIG. 4 is a schematic cross-sectional view for explaining the method of making a silicon carbide substrate.
Figure 5:
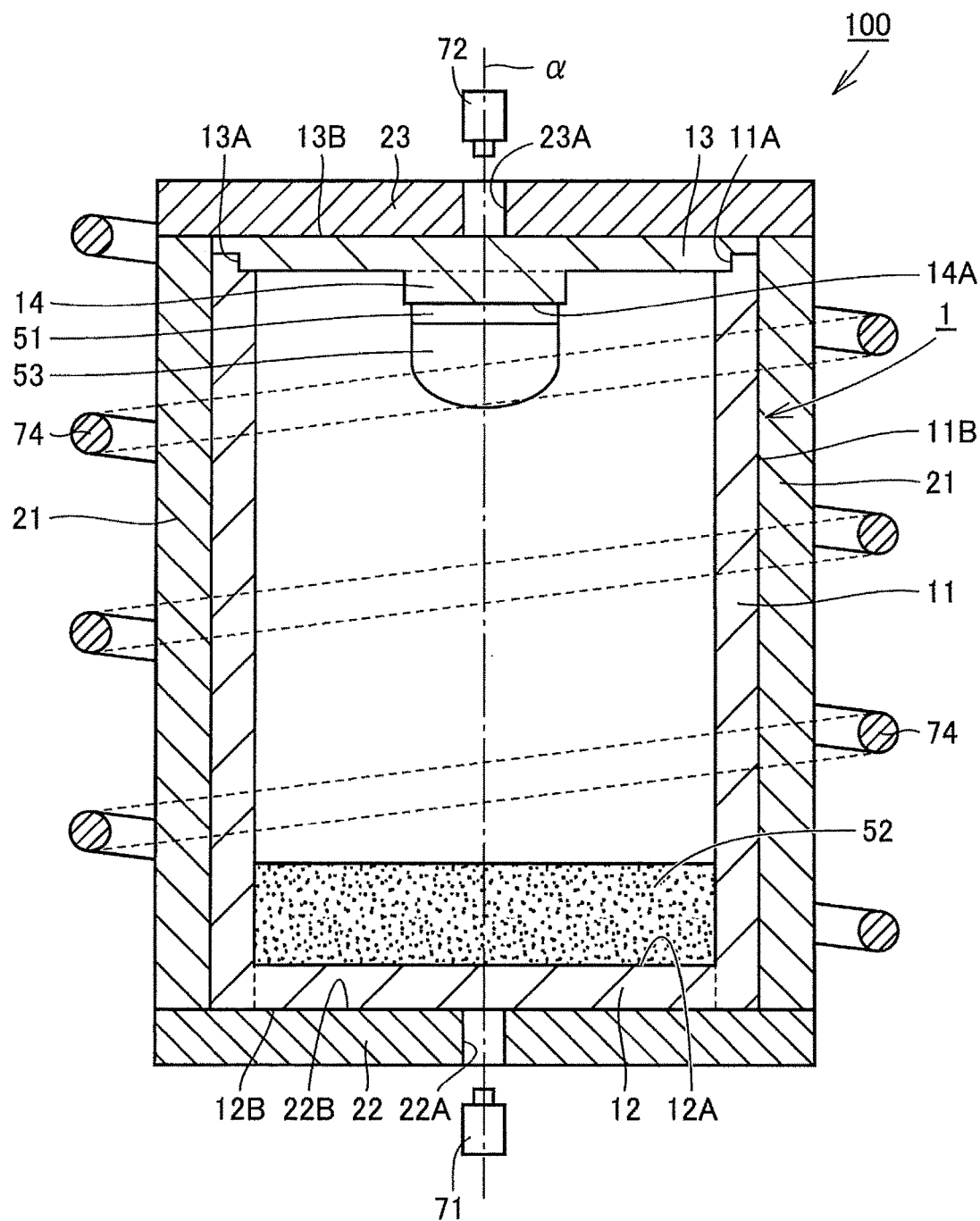
FIG. 5 is a schematic cross-sectional view for explaining the method of making a silicon carbide substrate.

In the following, an example of a method of making the silicon carbide substrate 9 of the present embodiment will be described, with reference to FIG. 3 to FIG. 5. The method of making the silicon carbide substrate 9 of the present embodiment utilizes a single-crystal manufacturing apparatus 100, illustrated in FIG. 4, to produce single crystal silicon carbide. By referring to FIG. 4, the single-crystal manufacturing apparatus 100 includes a crucible 1, heat insulating members 21, 22, and 23, radiation thermometers 71 and 72, and an induction heating coil 74.

The crucible 1 is made of a material, e.g., graphite, capable of being heated by induction heating. The crucible 1 includes a circumferential wall 11 of a cylindrical shape, a bottom wall 12 connected to the circumferential wall 11 to close one of the openings of the circumferential wall 11, and a lid 13 connected to the circumferential wall 11 to close the other opening of the circumferential wall 11 and having a holding part 14 for holding a seed crystal 51. In the present embodiment, the circumferential wall 11 is a hollow cylindrical shape. The bottom wall 12 has a disk shape. The circumferential wall 11 and the bottom wall 12 are formed as a unitary structure.

The lid 13 is detachable from the circumferential wall 11. A lid contact face 13A formed on the outer perimeter of the lid 13 and a circumferential wall contact face 11A formed on the inner perimeter of the circumferential wall 11 come in contact with each other, so that the lid 13 is fixed to the circumferential wall 11. The lid contact face 13A and the circumferential wall contact face 11A may have helical thread grooves, for example. One of the main surfaces of the lid 13 has the holding part 14 formed thereon that projects from the center of the main surface. With the lid 13 being mounted to the circumferential wall 11, the holding part 14 is situated such as to encompass a center axis α. The center axis α coincides with the center axis of the circumferential wall 11. The end of the holding part 14 has a holding face 14A for holding a seed crystal.

The heat insulating members 21, 22, and 23 are made of a molded heat insulating material, for example. The heat insulating members 21, 22, and 23 have a felt-like structure, for example, and are comprised of fibers having carbon as the main component. The heat insulating member 22 has a disk shape. The crucible 1 is placed on the heat insulating member 22 such that a contact face 22B of the heat insulating member 22 is in contact with an outer face 12B of the bottom wall 12. The heat insulating member 21 has a hollow cylindrical shape. The heat insulating member 21 is placed such as to cover the entirety of an outer surface 11B of the circumferential wall 11 of the crucible 1. The heat insulating member 23 is placed on an outer face 13B of the lid 13 such as to cover the outer face 13B of the lid 13 of the crucible 1. The crucible 1 is encapsulated with the heat insulating members 21, 22, and 23.

An area, inclusive of the center axis α, of the heat insulating member 22, has a penetrating hole 22A penetrating the heat insulating member 22 in the thickness direction. The radiation thermometer 71 is disposed to face the bottom wall of the crucible 1 through the penetrating hole 22A. The radiation thermometer 71 serves to measure the temperature of the bottom wall 12, thereby measuring the temperature of a raw material powder 52. An area, inclusive of the center axis α, of the heat insulating member 23, has a penetrating hole 23A penetrating the heat insulating member 23 in the thickness direction. The radiation thermometer 72 is disposed to face the lid 13 of the crucible 1 through the penetrating hole 23A. The radiation thermometer 72 serves to measure the temperature of the lid 13, thereby measuring the temperature of the seed crystal 51.

The induction heating coil 74 is helically placed to surround the outer surface 11B of the circumferential wall 11 of the crucible 1 that is covered with the heat insulating member 21. The induction heating coil 74 is coupled to a power supply (not shown). The crucible 1 covered with the heat insulating members 21, 22, and 23 is placed within the space surrounded by the induction heating coil 74.

In the following, a specific example of a method of making a silicon carbide substrate will be described. By referring to FIG. 3, the method of making a silicon carbide substrate according to the present embodiment first performs a raw material powder placing step, which is denoted as a step S10. In this step S10, the raw material powder 52 is placed such as to come in contact with an inner face 12A of the bottom wall 12 of the crucible 1 as illustrated in FIG. 4. Specifically, the raw material powder 52 is disposed inside the crucible 1 while the lid 13 is removed. In the present embodiment, a mixed powder made by adding carbon powder to silicon carbide powder is used as the raw material powder 52.

Next, a seed crystal placing step is performed as a step S20. In this step S20, the seed crystal 51 is placed on the holding part 14. The seed crystal 51 is made of silicon carbide having the 4H crystal structure. Specifically, the seed crystal 51 is attached to the holding part 14 of the lid 13 which is detached from the circumferential wall 11. The seed crystal 51 is attached to the holding face 14A of the holding part 14. The holding face 14A has a circular shape. The seed crystal 51 has a disk shape. A circular main surface of the seed crystal 51 is attached to the holding face 14A. A growth surface 51A of the seed crystal 51 faces the direction of the bottom wall 12. In the present embodiment, the diameter of the holding face 14A is greater than the diameter of the seed crystal 51 by 2% or more. The seed crystal 51 is placed in the area surrounded by the outer perimeter of the holding face 14A in a plan view. Namely, the entire outer perimeter of the seed crystal 51 is situated inside the outer perimeter of the holding face 14A. The center of the disk shape of the seed crystal 51 may coincide with the center of the circular shape of the holding face 14A.

Next, the lid 13 is mounted to the circumferential wall 11. With this, the seed crystal 51 is positioned in the area intersecting the center axis α. Through the above-noted steps S10 through S20, the raw material powder 52 and the seed crystal 51 are placed inside the crucible 1.

Next, a sublimation-recrystallization step is performed as a step S30. In this step S30, the raw material powder 52 is sublimated and recrystallized onto the seed crystal 51, thereby causing a single crystal 53 to grow on the seed crystal 51. Specifically, the crucible 1 in which the raw material powder 52 and the seed crystal 51 are disposed is covered with the heat insulating members 21, 22, and 23, for example. Further, the crucible 1 covered with the heat insulating members 21, 22, and 23 is placed in the space surrounded by the induction heating coil 74 as illustrated in FIG. 4. High frequency current is then applied to the induction heating coil 74, thereby heating the crucible 1 through induction heating.

In so doing, induction heating is performed such that the temperature of the raw material powder 52 becomes higher than the temperature of the seed crystal 51. As a result, a temperature gradient is formed such that the temperature along the central axis α corresponding to the growth direction is lower toward the seed crystal 51 and higher toward the raw material powder 52. The inside of the crucible 1 is set to an inactive gas atmosphere such as an argon atmosphere. In the present embodiment, further, nitrogen gas is introduced to the crucible 1.

With this arrangement, the raw material powder 52 sublimates, which creates raw material gas that is silicon carbide in the gas state. This raw material gas is supplied onto the seed crystal 51. Consequently, as illustrated in FIG. 5, the raw material gas is recrystallized on the seed crystal 51, thereby causing the single crystal 53 of silicon carbide having the 4H crystal structure to grow on the seed crystal 51. Nitrogen is trapped in the single crystal 53.

While this state is maintained, the single crystal 53 grows in the direction along the center axis α. Upon the passage of a predetermined heating time, heating comes to an end, which indicates the completion of the step S30.

Next, a slicing step is performed as a step S40. In this step S40, the single crystal 53 having grown inside the crucible 1 in step S30 is taken out of the crucible 1, and is then sliced. Specifically, the crucible 1 is moved out of the space surrounded by the induction heating coil 74 after the end of heating performed in step S30. Subsequently, the lid 13 of the crucible 1 is removed. The single crystal 53 is then taken off the lid 13. The collected single crystal 53 is sliced such that the main surface is at an angle of 4 degrees or less to the {0001} plane. In this manner, the silicon carbide substrate 9 having the main surface 91 (which is not yet planarized) is obtained (see FIG. 1).

Next, a surface planarizing step is performed as a step S50. In this step S50, the main surface 91 of the silicon carbide substrate 9 obtained in step S40 is planarized. Specifically, the main surface 91 is subjected to polishing such as MP (mechanical polishing) or CMP (chemical mechanical polishing). Cleaning and the like are then performed to provide the silicon carbide substrate 9 of the present embodiment as illustrated in FIG. 1.

In the method of making a silicon carbide substrate of the present embodiment, a mixed powder made by adding carbon powder to silicon carbide powder is used as the raw material powder 52 in the step S10 as previously described. Further, the diameter of the holding face 14A of the holding part 14 is greater than the diameter of the seed crystal 51 by 2% or more. This enables the manufacturing of the silicon carbide substrate 9 for which the standard deviation of minority carrier lifetime in the center area 93 of the main surface 91 as obtained by μ-PCD analysis is 0.7 ns or less.

In the case in which a silicon carbide substrate has a short carrier lifetime, sufficient conductivity modulation does not occur, resulting in the failure to provide a bipolar semiconductor device having a low on-resistance. One way to prolong the carrier lifetime is to reduce carbon vacancies, which cause crystal defects serving as a lifetime killer. An effective way to reduce carbon vacancies in the single crystal 53 of silicon carbide is to increase the ratio of carbon to silicon. Accordingly, adding carbon powder to silicon carbide powder to make the raw material powder 52 is a preferable measure for reducing carbon vacancies.

Use of carbon powder, however, may give rise to a risk of creating defects due to carbon powder dust. Specifically, carbon dust particles may be sent flying during the growth of the single crystal 53, which may create a risk of causing defects such as carbon inclusion in the single crystal 53. Carbon inclusion refers to a chunk of carbon on the order of micrometers mixed in single crystal. Carbon inclusions could cause stacking faults, dislocations, and different poly types.

In order to prevent the flying of carbon powder, carbon powder may be placed under silicon carbide powder such as to be covered with the silicon carbide powder. Namely, in the single-crystal manufacturing apparatus 100 illustrated in FIG. 4, carbon powder is first placed on the inner face 12A of the bottom wall 12 of the crucible 1, and, then, silicon carbide powder is placed on the carbon powder so as to cover the carbon powder. With this arrangement, the raw material powder 52 is arranged in a two-layer structure with carbon powder in the lower layer and silicon carbide powder in the upper layer: Such an arrangement allows carbon powder to be covered with silicon carbide powder, so that the carbon powder is not exposed to the inner space of the crucible 1. Causing the single crystal 53 to grow while carbon powder is not exposed to the inner space of the crucible 1 allows the single crystal 53 containing no carbon inclusion to be manufactured. Namely, the silicon carbide substrate containing no carbon inclusion is successfully manufactured. Another way to reduce the flying of carbon powder is to set the average particle size (D50) of carbon powder to twice or more than twice the average particle size (D50) of silicon carbide powder. Average particle size (D50) is measured by using a particle-size-distribution measurement apparatus of a layer interferometer type.

The ratio of carbon powder to silicon carbide powder may be 5% or less in terms of weight ratio, for example. Use of a carbon powder ratio of 5% or greater brings only a small increase in the degree to which carbon vacancies are effectively reduced while the use of such a carbon powder creates the risk of an increase in carbon-based defects.

According to the silicon carbide substrate of the present disclosure, the silicon carbide substrate of the present application can improve yield in the manufacturing of semiconductor devices.

All the embodiments disclosed herein are examples only, and should be interpreted as non-limiting in any aspects. The scope of the present invention is not defined by the descriptions provided heretofore, but is defined by the claims. Any modifications representing and within the equivalent scope of the claims are intended within the scope of the present invention.

DESCRIPTION OF REFERENCE SYMBOLS 1 crucible
11 circumferential wall
11A circumferential wall
11B outer surface
12 bottom wall
12A inner face
12B outer face
13 lid
13A lid contact face
13B outer face
14 holding part
14A holding face
21, 22, 23 heat insulating member
22A, 23A penetrating hole
22B contact face
51 seed crystal
51A growth surface
52 raw material powder
53 single crystal
71, 72 radiation thermometer
74 induction heating coil
9 silicon carbide substrate
91 main surface
92 outer perimeter area
93 center area
99 measurement point
100 single-crystal manufacturing apparatus
α center axis

The invention claimed is:

1. A silicon carbide substrate, comprising:
silicon carbide;
an impurity;
majority carriers; and
minority carriers,
wherein a density of the majority carriers is $1\times10^{17}$ cm$^{-3}$ or greater, and
wherein a standard deviation of lifetime of the minority carriers is 0.7 ns or less in an area other than an area within a distance of 5 mm from an outer perimeter of a main surface of the silicon carbide substrate, wherein the lifetime of the minority carriers is characterized by microwave photoconductivity decay.

2. The silicon carbide substrate as claimed in claim 1, wherein the standard deviation is 0.4 ns or less.

3. The silicon carbide substrate as claimed in claim 1, whose diameter is 100 mm or greater.

4. The silicon carbide substrate as claimed in claim 1, whose diameter is 150 mm or greater.

5. The silicon carbide substrate as claimed in claim 1, wherein an average of the lifetime of the minority carriers is 1 µs or less.

6. The silicon carbide substrate as claimed in claim 1, wherein an average of the lifetime of the minority carriers is 100 ns or less.

7. The silicon carbide substrate as claimed in claim 1, wherein an average of the lifetime of the minority carriers is 50 ns or less.

8. The silicon carbide substrate as claimed in claim 1, comprising no carbon inclusion.

9. The silicon carbide substrate as claimed in claim 1, wherein the silicon carbide has a 4H crystal structure.

10. The silicon carbide substrate as claimed in claim 1, wherein an off-angle of the main surface from {0001} plane of the silicon carbide is 4 degrees or less.

11. The silicon carbide substrate as claimed in claim 1, wherein a thickness of the silicon carbide substrate is 300 µm or greater.

12. The silicon carbide substrate as claimed in claim 1, wherein a thickness of the silicon carbide substrate is 600 µm or greater.

13. The silicon carbide substrate as claimed in claim 1, wherein the impurity is nitrogen.

* * * * *